US006997759B1

(12) United States Patent
Zahnen et al.

(10) Patent No.: US 6,997,759 B1
(45) Date of Patent: Feb. 14, 2006

(54) ELECTRICAL CONNECTOR INCLUDING MOVEABLE CABLE SEATING INDICATORS AND ASSOCIATED METHODS

(75) Inventors: James L. Zahnen, Ormond Beach, FL (US); Roy E. Jazowski, Ormond Beach, FL (US); Paul W. Lubinsky, Palm Coast, FL (US)

(73) Assignee: Homac Mfg. Company, Ormond Beach, FL (US)

( * ) Notice: Subject to any disclaimer, the term of this patent is extended or adjusted under 35 U.S.C. 154(b) by 0 days.

(21) Appl. No.: 11/026,810

(22) Filed: Dec. 30, 2004

(51) Int. Cl.
*H01R 11/09* (2006.01)

(52) U.S. Cl. ....................................... 439/798; 439/901

(58) Field of Classification Search ................ 439/798, 439/797, 796, 521, 135, 910, 275, 488
See application file for complete search history.

(56) References Cited

U.S. PATENT DOCUMENTS

| | | | | |
|---|---|---|---|---|
| 3,740,692 | A | 6/1973 | Filhaber | 339/19 |
| 4,629,351 | A | 12/1986 | Kato et al. | 403/27 |
| 4,850,896 | A | 7/1989 | Smith et al. | 439/489 |
| 4,907,982 | A | 3/1990 | Wagaman | 439/271 |
| 4,932,898 | A | 6/1990 | Goodman et al. | 439/582 |
| 5,364,281 | A * | 11/1994 | Leto | 439/100 |
| 5,484,304 | A | 1/1996 | Capper et al. | 439/409 |
| 5,533,912 | A | 7/1996 | Fillinger et al. | 439/521 |
| 5,727,314 | A | 3/1998 | Ashcraft | 29/884 |
| 5,780,775 | A | 7/1998 | Yu | 174/135 |
| 5,823,817 | A | 10/1998 | Pyle | 439/447 |
| 5,848,913 | A | 12/1998 | Ashcraft | 439/521 |
| 5,931,708 | A | 8/1999 | Annas et al. | 439/798 |
| 6,074,591 | A | 6/2000 | Privett | 264/278 |
| 6,250,950 | B1 | 6/2001 | Pallai | 439/441 |
| 6,325,675 | B1 * | 12/2001 | Harmeyer | 439/709 |
| 6,361,381 | B1 * | 3/2002 | Koebbe | 439/810 |
| 6,656,000 | B1 | 12/2003 | Abdo | 439/797 |
| 6,688,921 | B1 * | 2/2004 | Borgstrom et al. | 439/798 |
| 6,817,910 | B1 | 11/2004 | Borgstrom et al. | 439/798 |
| 6,854,996 | B1 * | 2/2005 | Yaworski et al. | 439/276 |
| 2003/0087552 | A1 | 5/2003 | Borgstrom et al. | 439/590 |
| 2004/0142588 | A1 | 7/2004 | Borgstrom et al. | 439/135 |

OTHER PUBLICATIONS

Blackburn—Thomas & Betts, Product Page, "Type USB Wide Port Spacing Set Screw Connectors", pp. 1-2, printed Oct. 18, 2004, http://util-cat.thb.com/tnbcat/bburn_print.start_print? P_cat_id=60177.

(Continued)

*Primary Examiner*—Gary Paumen
*Assistant Examiner*—Phuongchi Nguyen
(74) *Attorney, Agent, or Firm*—Allen, Dyer, Doppelt, Milbrath & Gilchrist, P.A.

(57) ABSTRACT

An electrical connector for electrical cables includes an electrically conductive body, an insulating cover, and moveable cable seating indicators aligned with seating indicator openings in the conductive body. The electrically conductive body may have spaced apart cable-receiving passageways for receiving respective electrical cable ends therein, and with each cable-receiving passageway may have a cable inlet opening and a cable end viewing opening opposite the cable inlet opening. The electrically conductive body may also have at least one respective fastener-receiving passageway intersecting each of the cable-receiving passageways. A respective fastener may be provided in each of the fastener-receiving passageways. The moveable cable seating indicators provide a cover and permit visual confirmation of proper placement of the electrical cable end within a corresponding one of the cable-receiving passageways.

29 Claims, 7 Drawing Sheets

OTHER PUBLICATIONS

Blackburn—Thomas & Betts, Product Page, "Type USB-S Economy Spacing Set Screw Connectors", pp. 1-2, printed Oct. 18, 2004, http://util-cat.thb.com/tnbcat/bburn__print.start__print? P__cat__id=60178.

Raychem/Tyco Electronics advertisement introducing the "Gel-Fulled GelPort" undated.

Michaud Connector, K 197 6-35mm Cu, 100A IPPC (pp. 1-4) undated.

The Homac Companies, product page, "'Flood-Seal' Rubberized Aluminum Bar", undated.

The Homac Companies, product page, "'Flood-Seal' RXM Series Rubberized Aluminum Bar", undated.

Sicame Corp., advertisement for Piranha Undergroup Insulation, "Introducing the 'No Worries' Connector", used in Australia since 1993, undated.

* cited by examiner

ELECTRICAL CONNECTOR INCLUDING MOVEABLE CABLE SEATING INDICATORS AND ASSOCIATED METHODS

FIELD OF THE INVENTION

The present invention relates to the field of electrical components, and, more particularly, to an electrical connector for connecting together a plurality of cable ends, and associated methods.

BACKGROUND OF THE INVENTION

Underground and submersible junction bus connectors are widely used in electrical power distribution systems. One type of such connector is offered under the designation SWEETHEART® by Homac Mfg. Company of Ormond Beach, Fla., the assignee of the present invention. The SWEETHEART® connector is a cast or welded aluminum connector including a bus, or bar, portion and a series of tubular posts extending outwardly from the bus portion. The posts have an open upper end to receive one or more electrical conductors. A threaded bore is provided in the sidewall of the post, and which receives a fastener to secure the electrical conductor within the upper end of the post. An insulating coating is provided on the lower portion of the posts and bus of the connector. In addition, EPDM insulating sleeves may be used to provide waterproof seals for the posts. U.S. Pat. Nos. 6,347,966; 6,345,438 and 6,262,567 disclose various embodiments of such bus and post connectors.

Homac also manufacturers a RAB series of "Flood Seal"@ Rubberized Aluminum Bar connectors suitable for direct burial, handhole or pedestal applications. The RAB connector includes a generally rectangular aluminum body having a plurality of spaced apart cable-receiving passageways therein. These cable-receiving passageways are blind holes, that is, they extend inward, but do not extend fully through the connector body. The blind hole is useful to provide sealing at the lower end of the connector body for the later molding of the rubber insulating cover.

The connector body also has a fastener-receiving passageway intersecting each cable-receiving opening. A fastener is provided in each fastener receiving passageway. Each fastener comprises a blunt end for bluntly contacting a corresponding insulation-free cable end. In particular, the blunt end may be a ball bottom screw end that helps break up aluminum oxides of the insulation-free cable end to ensure better electrical contact.

As the name states, the RAB connector includes a rubber insulating cover over the connector body. The insulating cover includes integrally molded inlets for both the cable-receiving openings and fastener-receiving openings. An insulating boot, such as a cable size adaptor or Rocket may be provided for the cable-receiving inlet, and a sealing cap may be received over the screw in the fastener-receiving inlet. Unfortunately, with less experienced labor crews, it is possible that a cable end may not be fully seated in its blind hole. Thus, even if the fastener initially presses partially against the cable end, this connection may work lose as the RAB connector is subsequently repositioned.

U.S. Pat. No. 6,688,921 to Borgstrom et al. discloses a connector similar to the Homac RAB series connector. In place of EPDM, the patent uses a thermoplastic elastomer (TPE) that combines the properties of thermoplastic with the performance characteristics of a thermoset rubber. The use of TPE enables the molding to further form sealing plugs and cable size adaptors attached to the cover with respective tethers. The connector also includes blind cable-receiving passageways, and is thus also susceptible to less reliable connections if the cable ends are not fully seated.

Michaud Electrical Equipment of France offered an insulation displacing connector (IDC) including a generally rectangular connector body, and transverse cable-receiving and fastener-receiving passageways. More particularly, the connector body included a backwall having a pattern of sharp ridges thereon to pierce the insulation on the cable end as the end of the fastener engages and presses against the cable end from the opposite side. To be sure the cable end is fully pressed onto the sharp ridges, a plastic viewing window is provided opposite the inlet of the cable-receiving passageway. Accordingly, an installer can view the cable end to be sure the insulation has been pierced. The window is adjacent the rubber cover. Unfortunately, the Michaud IDC device is likely to leak at the window since the seal is only a mechanical seal. In addition, insulation displacement technology may not be suitable for larger cable sizes with thicker insulation coverings.

SUMMARY OF THE INVENTION

In view of the foregoing background, it is therefore an object of the present invention to provide an electrical connector that is craft-friendly for installation, readily manufactured, and resistant to leaks in service.

This and other objects, features and advantages in accordance with the present invention are provided by an electrical connector for a plurality of electrical cables comprising an electrically conductive body, an insulating cover, and a plurality of moveable cable seating indicators aligned with cable end openings in the conductive body. More particularly, the electrically conductive body may have a plurality of spaced apart cable-receiving passageways for receiving respective electrical cable ends therein, and with each cable-receiving passageway having a cable inlet opening and a cable end opening opposite the cable inlet opening. The electrically conductive body may also have at least one respective fastener-receiving passageway intersecting each of the cable-receiving passageways. A respective fastener may be provided in each of the fastener-receiving passageways. In addition, each moveable, electrically insulating, cable seating indicator may be positioned adjacent a respective cable end opening. The moveable seating indicators thereby provide a cover and permit visual confirmation of proper placement of the electrical cable end within a corresponding one of the cable-receiving passageways.

The connector may also include the insulating cover on the electrically conductive body and having respective seating indicator openings therein aligned with the cable seating indicators. In addition, the insulating cover may comprise TPE forming an integrally molded bond with adjacent portions of the moveable cable seating indicators.

Each of the moveable cable seating indicators may comprise a mounting flange and a pop-out indicator extending outwardly therefrom, with the mounting flange being overlapped by adjacent portions of the insulating cover. The mounting flange and the pop-out indicator may be integrally formed as a monolithic unit, for example. Each moveable cable seating indicator may comprise TPE to form a strong bond with the TPE of the insulating cover.

The insulating cover may comprise an integrally molded respective tubular cable inlet aligned with each of the cable inlet openings. In addition, the electrical connector may further include a respective insulating boot received in each of the tubular cable inlets. Each insulating boot may comprise a tubular sidewall having a progressively increasing diameter to an outer open end thereof. A respective removable boot closure cap may be associated with the open outer end of each of the insulating boots.

The insulating cover may further comprise an integrally molded respective tubular fastener inlet aligned with each of the fastener-receiving passageways. A respective removable fastener inlet closure cap may be included for each of the tubular fastener inlets. Moreover, a respective flexible tether may be connected between each of the tubular fastener inlets and a corresponding one of the removable fastener inlet closure caps. The electrically conductive body may have a generally rectangular shape, and be formed of aluminum, for example.

A method aspect of the invention is for making an electrical connector for a plurality of electrical cables. The method may include forming an electrically conductive body to have a plurality of spaced apart cable-receiving passageways for receiving respective insulation-free electrical cable ends therein. Each cable-receiving passageway may have a cable inlet opening and a cable end opening opposite the cable inlet opening. The conductive body may also be formed to have at least one respective fastener-receiving passageway intersecting each of the cable-receiving passageways.

The method may further include aligning a respective moveable, electrically insulating, cable seating indicator adjacent each of the cable end openings to provide a cover and to permit visual confirmation of proper placement of the electrical cable end within a corresponding one of the cable-receiving passageways. In addition, the method may include overmolding an insulating cover on the electrically conductive body and having a respective seating indicator opening therein aligned with each of the cable seating indicators. The insulating cover may comprise TPE forming an integrally molded bond with adjacent portions of the moveable, electrically insulating, cable seating indicators.

DETAILED DESCRIPTION OF THE PREFERRED EMBODIMENTS

Figure 1:
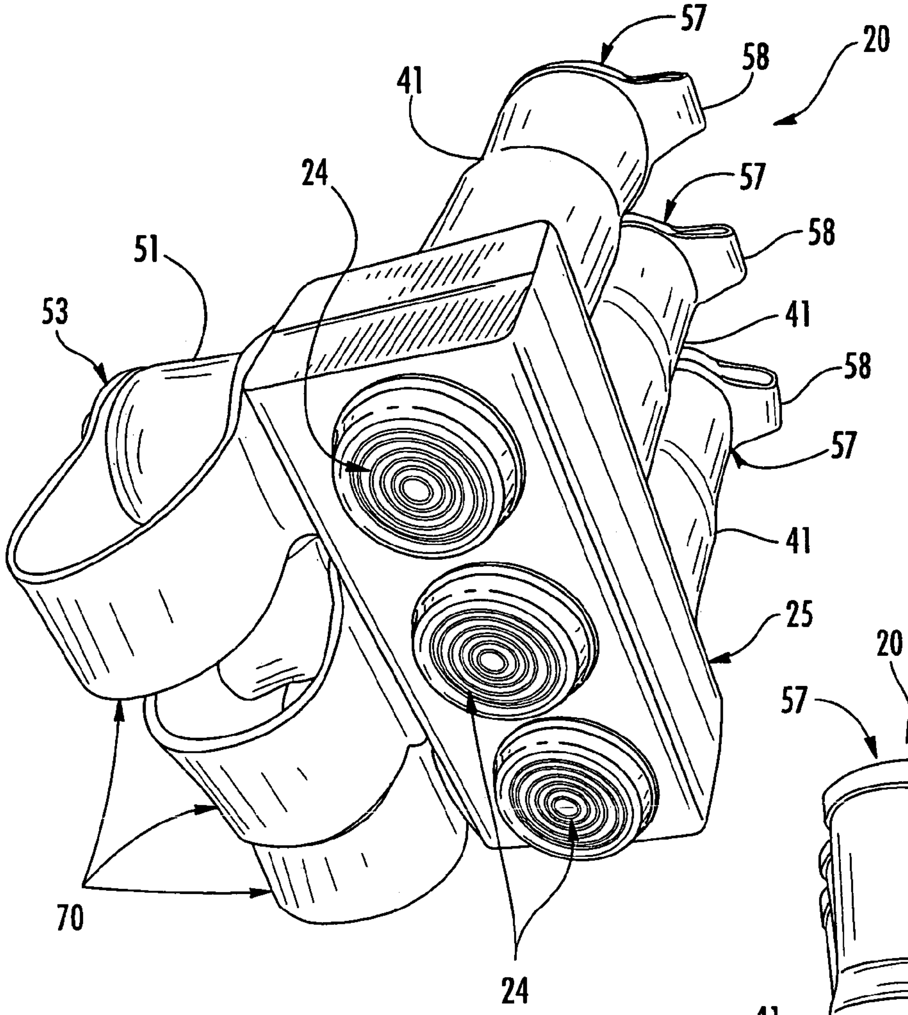
FIG. 1 is a rear-bottom perspective view of an embodiment of an electrical connector in accordance with the present invention.
Figure 2:
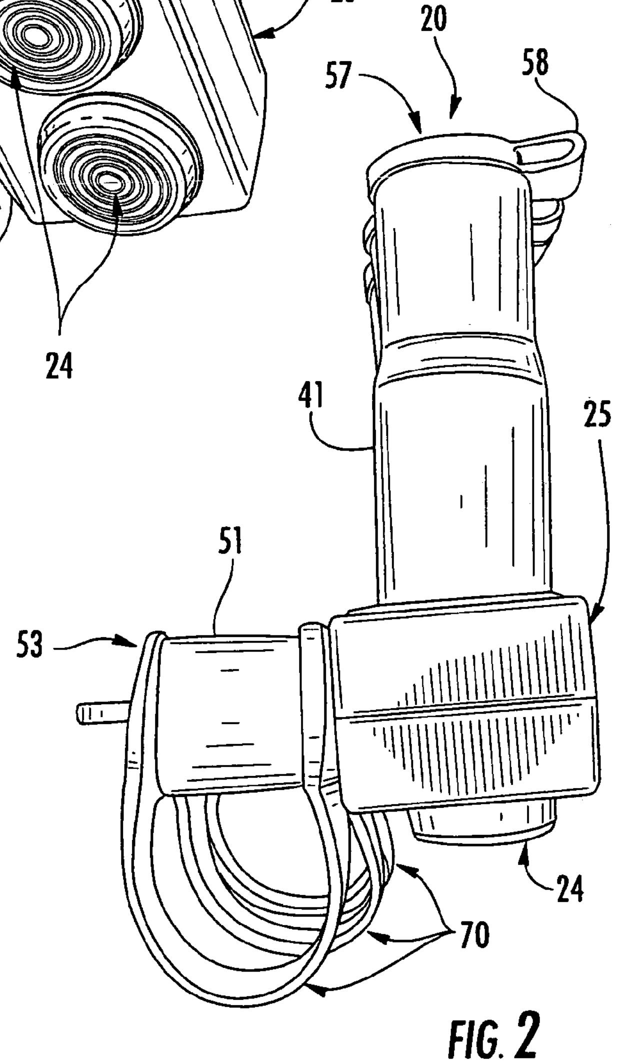
FIG. 2 is a side elevational view of the electrical connector as shown in FIG. 1.
Figure 3:
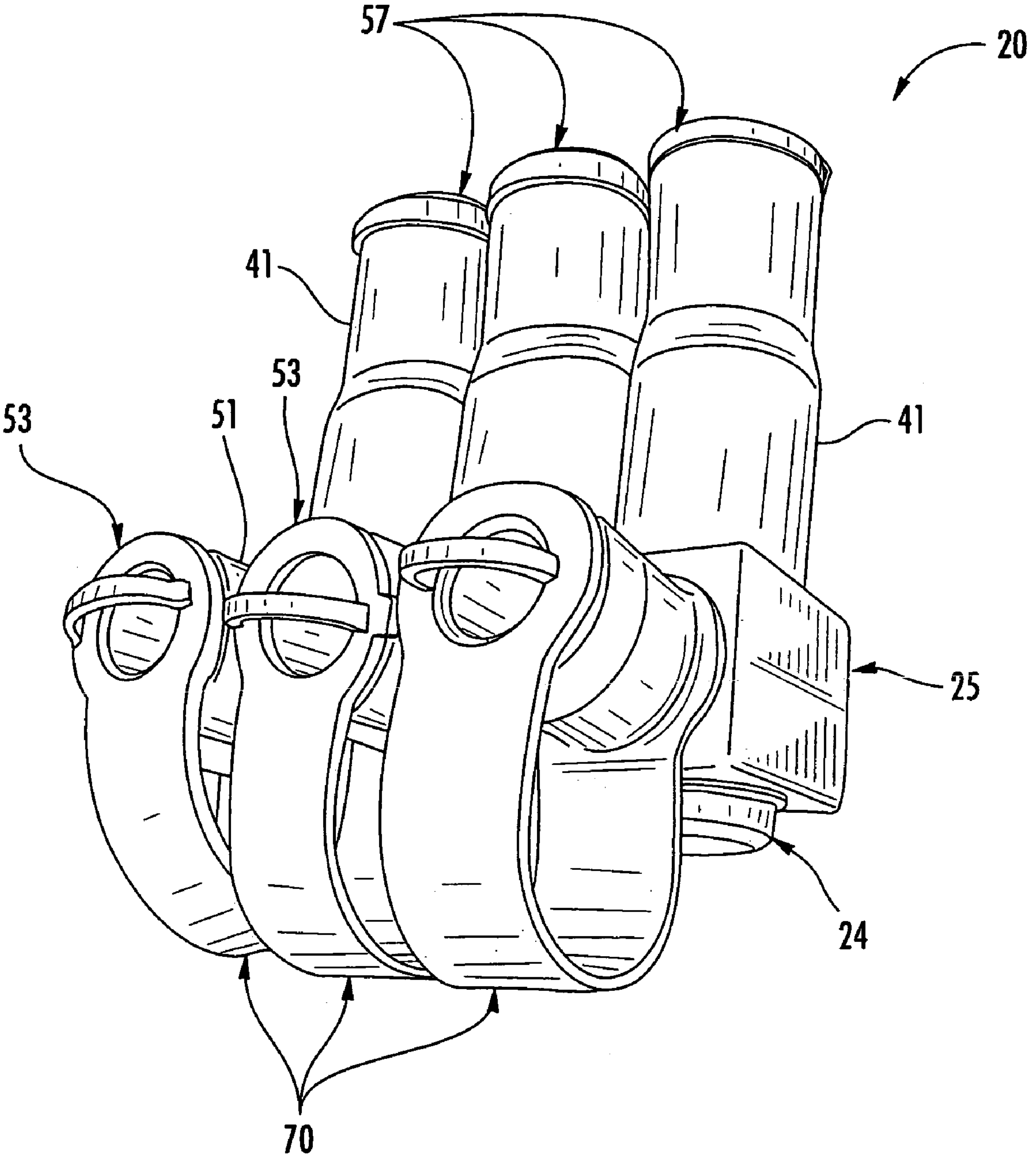
FIG. 3 is a top perspective view of the electrical connector as shown in FIG. 1.

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout, and prime notation is used in alternate embodiments to indicate similar elements.

Referring now initially to FIGS. 1–7, an electrical connector 20 in accordance with the present invention is described. The electrical connector 20 is for a plurality of electrical cables and illustratively comprises an electrically conductive body 21 (FIG. 4), an insulating cover 25, and a plurality of windows 24 aligned with cable end viewing openings 23 (FIGS. 4 and 7) in the conductive body. The electrically conductive body 21 illustratively has a generally rectangular shape, and may be formed of aluminum, or other conductive material, for example.

Figure 4:
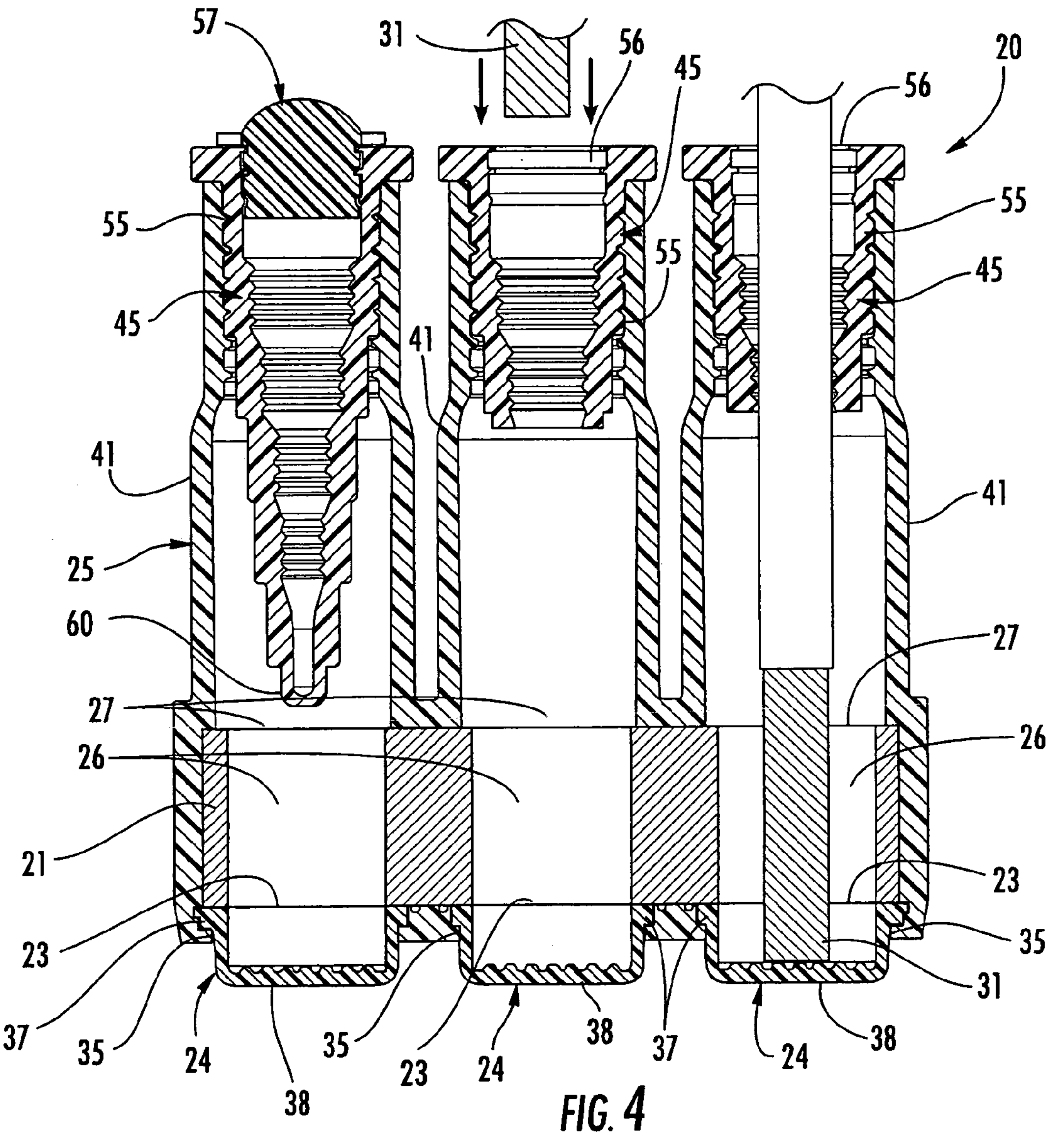
FIG. 4 is a longitudinal cross-sectional view of the electrical connector as shown in FIG. 1.

The electrically conductive body 21 also has a plurality of spaced apart cable-receiving passageways 26 for receiving respective insulation-free electrical cable ends 31 therein. FIG. 4 illustrates a leftmost cable receiving passageway 26 unused, a center passageway 26 about to receive a cable end 31, and a rightmost cable receiving passageway having already received therein the cable end 31. In the illustrated embodiment of the electrical connector 20, three such passageways 26 are provided, however in other embodiments, two or four or more such passageways may also be provided as will be appreciated by those skilled in the art.

Figure 7:
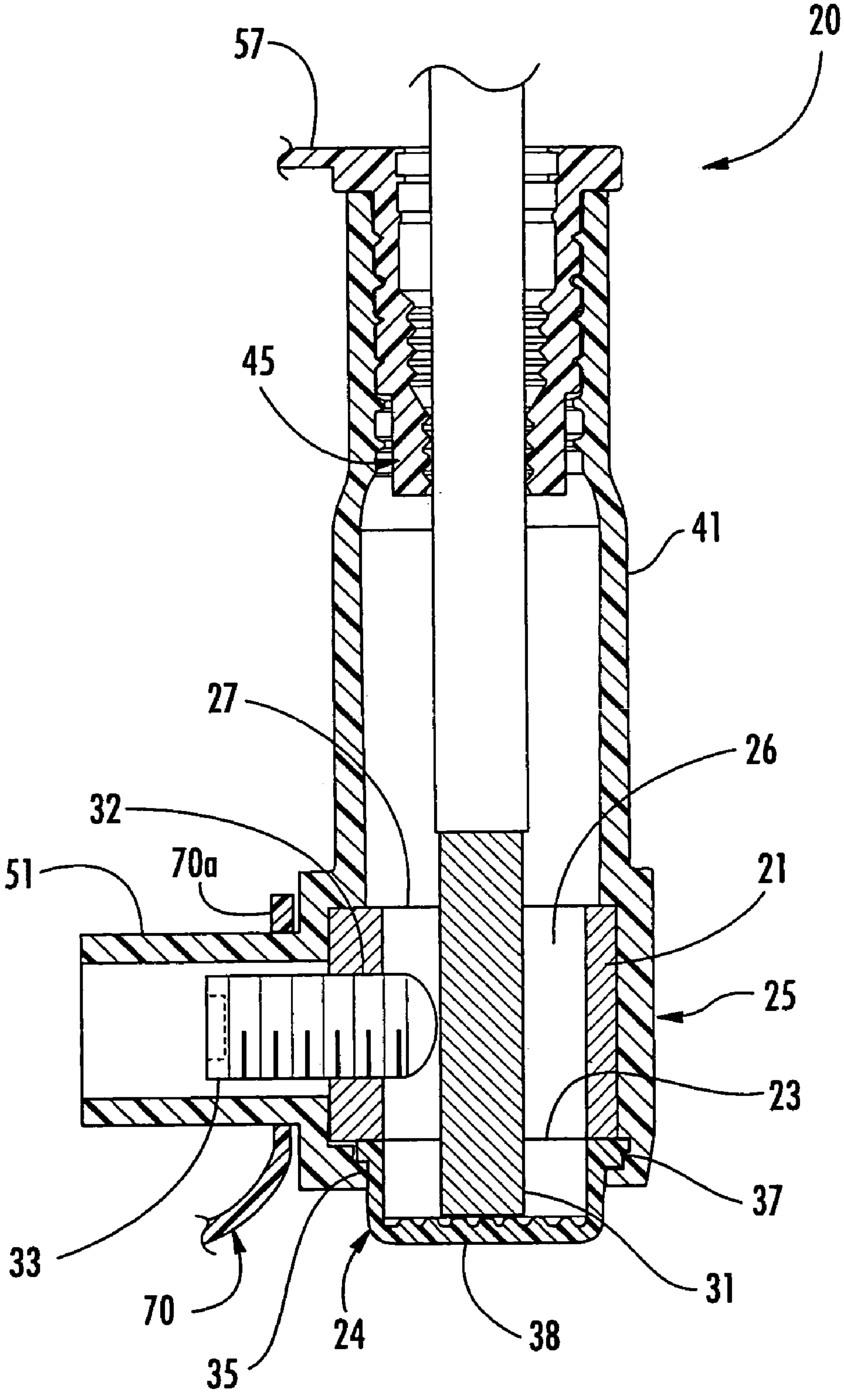
FIG. 7 is a transverse cross-sectional view of the electrical connector as shown in FIG. 1.

Each cable-receiving passageway 26 has a cable inlet opening 27 and the cable end viewing opening 23 opposite the cable inlet opening. The electrically conductive body 21 also illustratively has a respective fastener-receiving passageway 32 intersecting each cable-receiving passageway 26 (FIG. 7). A respective fastener 33 is also provided in each of the fastener-receiving passageways 32 (FIG. 7). The fastener 33 may be a hex head fastener, with a rounded contacting end, for example. In addition, in other embodiments, two or more fasteners may be used for each cable end 31 as will be appreciated by those skilled in the art.

Each electrically insulating transparent viewing window 24 may be positioned adjacent a respective cable end viewing opening 23. The windows 24 thereby provide a cover and permit visual confirmation of proper placement of the insulation-free electrical cable end 31 within a corresponding one of the cable-receiving passageways 26. By transparent is meant that proper positioning of the cable end 31 is visible therethrough. Accordingly, although the window 24 can be fully transparent, transparent is also meant to include partially transparent or translucent where proper seating of the cable end is still viewable.

The insulating cover 25 on the electrically conductive body 21 also has respective window openings 35 therein aligned with the transparent viewing windows 24. The insulating cover 25 may preferably comprise TPE in some embodiments thereby forming an integrally molded bond with adjacent portions of the transparent viewing windows 24 as will be appreciated by those skilled in the art.

Figure 5:
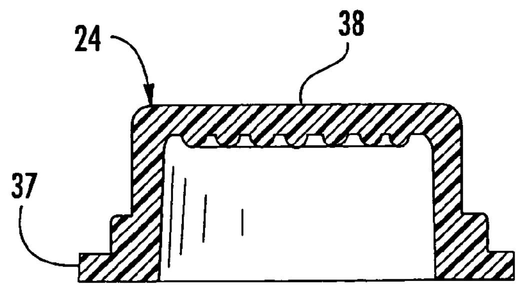
FIG. 5 is an enlarged cross-sectional view of the transparent window used in the electrical connector as shown in FIG. 1.
Figure 6:
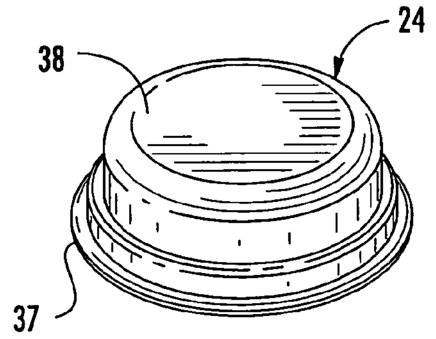
FIG. 6 is an enlarged perspective view of the transparent window used in the electrical connector as shown in FIG. 1.

With particular reference to FIGS. 5 and 6, each of the transparent viewing windows 24 may comprise a mounting flange 37 and a lens 38 extending outwardly therefrom. This configuration of the transparent viewing window 24 and through-holes as contrasted with blind holes permits the cable end 31 to extend further past the fastener 33 to thereby result in a more secure connection as will be appreciated by those skilled in the art.

The mounting flange 37 is illustratively overlapped by adjacent portions of the insulating cover as shown perhaps best in FIGS. 4 and 7. The mounting flange 37 and the lens 38 may be integrally formed as a monolithic unit, for example, such as by molding. Each transparent viewing window 24 may comprise polypropylene to form a strong bond with the TPE of the insulating cover 25. Other similar compatible materials may also be used that are moldable and that form a strong bond to the material of the insulating cover 25. The window 24 may serve to close or seal the cable-receiving passageway 26 during molding of the insulating cover 25. In addition, the outwardly extending lens 38 and through hole configuration of the cable-receiving passageway 26, permits the cable end 31 to extend well past the fastener 33 so that a strong and reliable electrical and mechanical connection is produced as will be appreciated by those skilled in the art.

The insulating cover 25 also illustratively includes an integrally molded respective tubular cable inlet aligned 41 with each of the cable inlet openings 27. The electrical connector may further include a respective insulating boot 45 received in each of the tubular cable inlets 41 as will be described in greater detail below.

The insulating cover 25 also illustratively comprises an integrally molded respective tubular fastener inlet 51 aligned with each of the fastener-receiving passageways 32 (FIG. 7). A removable fastener inlet closure cap 53 is provided to permit tightening of the fastener 33 and thereafter provide an environmental seal. For an unused cable position, the fastener inlet closure cap 53 may be left in its originally installed position as will be appreciated by those skilled in the art.

Figure 8:
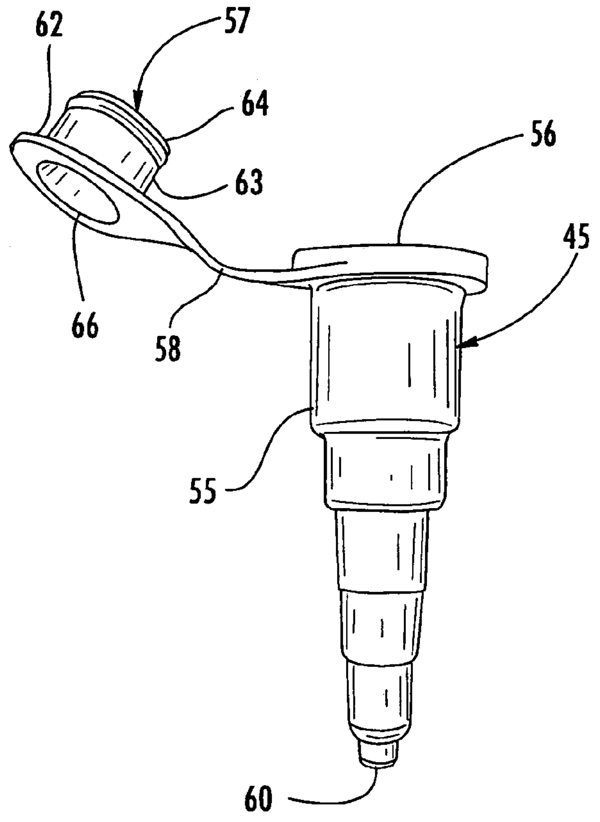
FIG. 8 is a side elevational view of an insulating boot and integrally formed removable boot closure cap as used in the electrical connector of FIG. 1.
Figure 9:
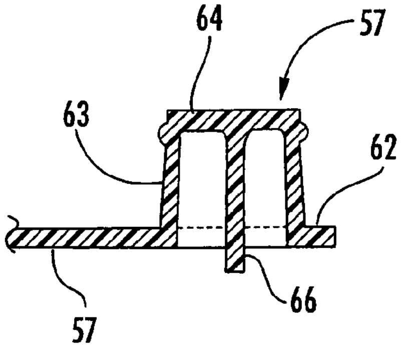
FIG. 9 is a cross-sectional view of the removable boot closure cap as shown in FIG. 5.

Referring now additionally to FIGS. 8 and 9, additional aspects of the insulating boot 45 of the electrical connector 20 are now described. Each insulating boot 45 may comprise a tubular sidewall 55 having a progressively increasing diameter to an outer open end 56 thereof. The insulating boot 45 also comprises a closed inner end 60 connected to the tubular sidewall 55 opposite the open outer end 56 thereof. In the illustrated embodiment, the diameter of the tubular sidewall 55 is stepped to permit severing along a desired diameter to accommodate a correspondingly sized cable end 31 as will be appreciated by those skilled in the art. In other words, the insulating boot 45 may serve as a cable size adaptor as will be appreciated by those skilled in the art.

A respective removable boot closure cap 57 is illustratively included for the open outer end 56 of the insulating boot 45. The insulating boot 45 also includes an integrally molded tether 58 connecting the removable boot closure cap 57 to the tubular sidewall 55. Accordingly, the removable boot closure cap 57 is readily available if needed for use, and is readily formed along with the other components of the insulating boot 45 during manufacturing. For example, the insulating boot 45 may be molded from TPE material, although other materials may also be used.

The removable boot closure cap 57 includes a flange 62, and a hollow cylindrical plug 63 having a closed end 64 extending from the flange. Of course, the plug 63 could be solid in other embodiments. The removable boot closure cap 57 also illustratively includes a gripping member or tab 66 extending within the hollow cylindrical plug 63 and beyond the flange 62. The gripping member 66 facilitates manual grasping or grasping using a suitable tool to permit removal or insertion of the boot closure cap 57. As will be appreciated by those skilled in the art, the flange 62, hollow cylindrical plug 63, and gripping member 66 may be integrally formed as a monolithic unit with the tether 58 and the tubular sidewall 55. The removable boot closure cap 57 can be inserted for an environmental seal to permit the boot 45 to be used even after it has been cut to receive a cable end 51, and the cable thereafter removed.

Figure 11:
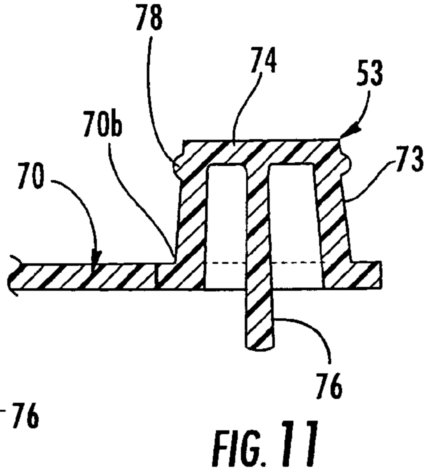
FIG. 11 is a cross-sectional view of the removable fastener inlet closure cap as shown in FIG. 8.
Figure 10:
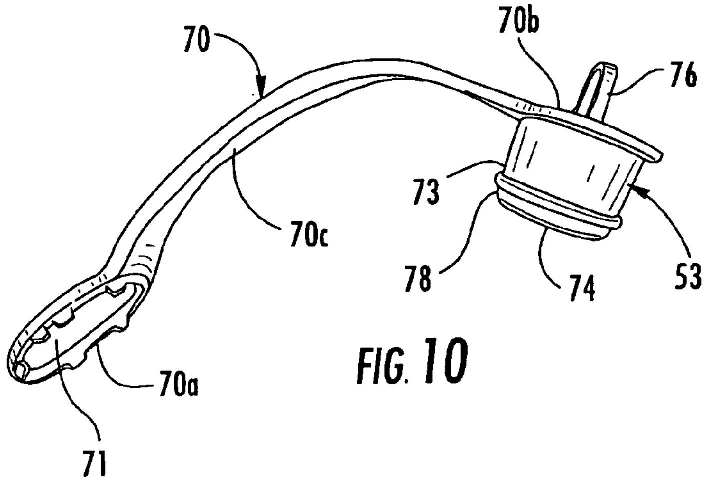
FIG. 10 is a side elevational view of a tether and an integrally formed removable fastener inlet closure cap as used in the electrical connector of FIG. 1.
Figure 12:
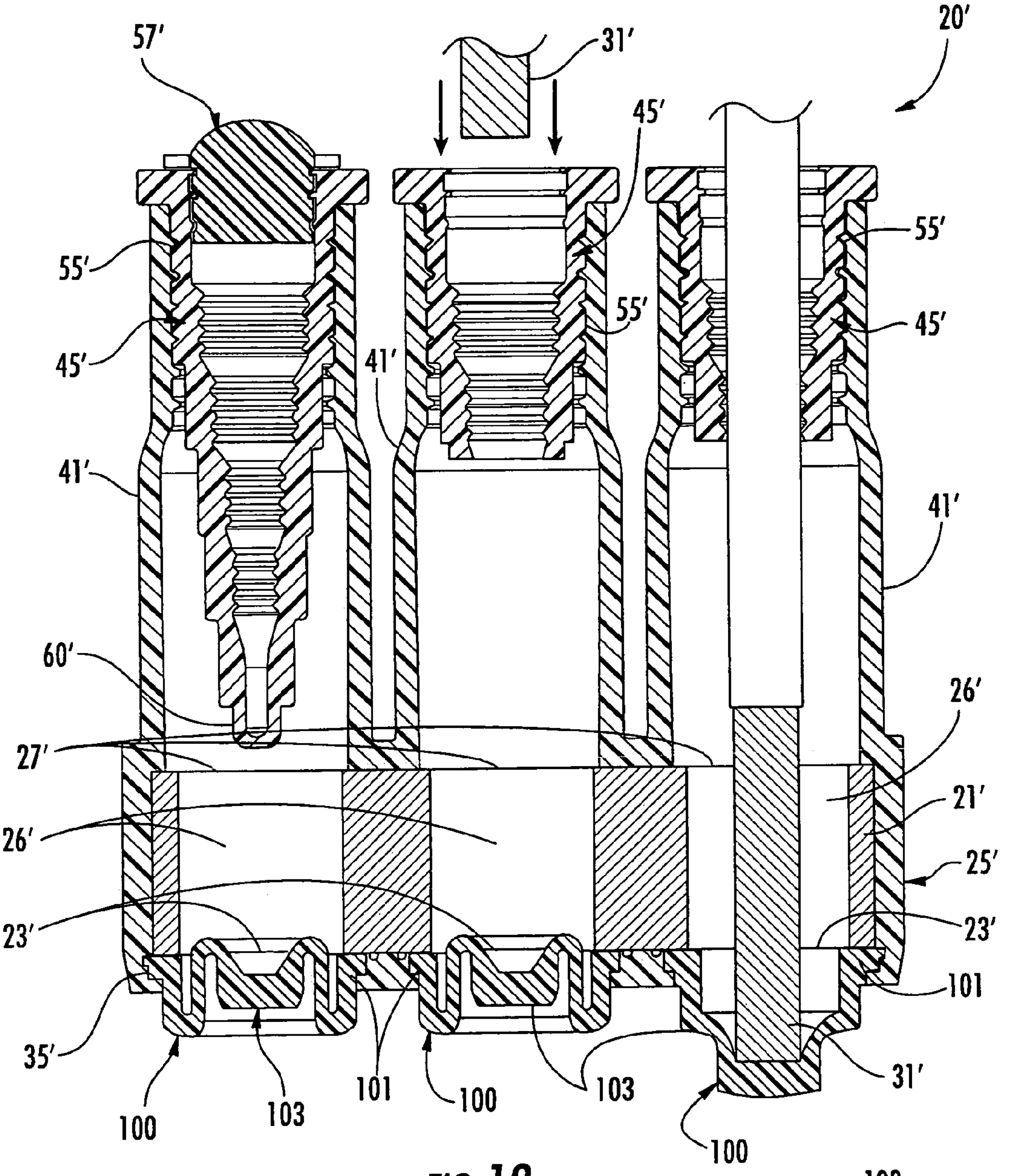
FIG. 12 is a cross-sectional view of another embodiment of an electrical connector in accordance with the present invention.

Referring now additionally to FIGS. 10 and 11, other features of the electrical connector 20 are now described. As noted above, the electrical connector 20 includes a respective removable fastener inlet closure cap 53 for each tubular fastener inlet 51, and a respective flexible tether 70 having a proximal end **70*a* removably connected adjacent a corresponding tubular fastener inlet 51 and a distal end 70*b* integrally molded with a corresponding removable fastener inlet closure cap 53**.

As shown in the illustrated embodiment, the flexible tether 70 may comprise a flexible elongate base with enlarged width distal and proximal ends **70*a*, 70*b* and a reduced width medial portion 70*c* therebetween. The proximal end 70*a* of the flexible elongate base illustratively has a ring shape defining an opening 71 to be removably positioned surrounding a corresponding one of the tubular fastener inlets 51**. Other configurations are also possible; however, the ring shape permits slight elastic expansion to secure the ring around the outside of the fastener inlet as will be appreciated by those skilled in the art.

The removable fastener inlet closure cap 53 includes a flange provided by the enlarged width distal end **70*b* of the base, and a hollow cylindrical plug 73 having a closed end 74 extending from the flange. In other embodiments, the plug 73 could be solid, for example. The removable fastener inlet closure cap 53 also illustratively includes a gripping member or tab 76 extending within the hollow cylindrical plug 73 and beyond the enlarged width distal eng 70*b*. The gripping member 76 facilitates manual grasping or grasping using a suitable tool to permit removal or insertion of the fastener inlet closure cap 53. The cylindrical plug 73 also includes an integrally molded peripheral friction rib 78 in the illustrated embodiment. As will be appreciated by those skilled in the art, the cylindrical plug 73, and gripping member 76 may be integrally formed as a monolithic unit with the tether 70. As will be appreciated by those skilled in the art, because of its relative large size and ruggedness, the tether 70 itself may be grasped and used to manipulate the fastener inlet closure cap 53**.

The flexible tether 70 and removable fastener inlet closure cap 53 may be molded separately and thereafter installed on the fastener inlet 51 of the cover, in contrast to the similar tether and cap disclosed in U.S. Pat. No. 6,688,921 to Borgstrom et al. as discussed in the Background of the Invention section. In the Borgstrom et al. patent, the tether, its associated cap and an insulating boot are all molded simultaneously with the insulation cover. This may make molding more difficult and complicated as compared to the separate tether and cap, and separate insulating boot described herein. The separate tether and cap, and separate insulating boot may permit different materials and/or properties to be provided for these components as will also be appreciated by those skilled in the art.

Referring now to FIGS. 12–15 another embodiment of an electrical connector 20' is now described. In this embodiment, the transparent windows described above are replaced with moveable cable seating indicators 100. The moveable cable seating indicators 100 also provide a cover and permit visual confirmation of proper placement of the insulation-free electrical cable end 31' within a corresponding one of the cable-receiving passageways 26'. Also in this embodiment, the cable end viewing openings of the conductive body 21' may be considered as seating indicator openings 23' therein aligned with the moveable cable seating indicators 100. In addition, the insulating cover 25' may comprise the TPE forming an integrally molded bond with adjacent portions of the moveable cable seating indicators 100.

Figure 13:
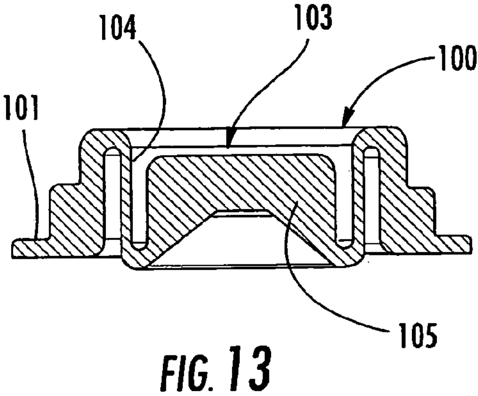
FIG. 13 is an enlarged cross-sectional view of the cable seating indicator used in the electrical connector as shown in FIG. 12.
Figure 14:
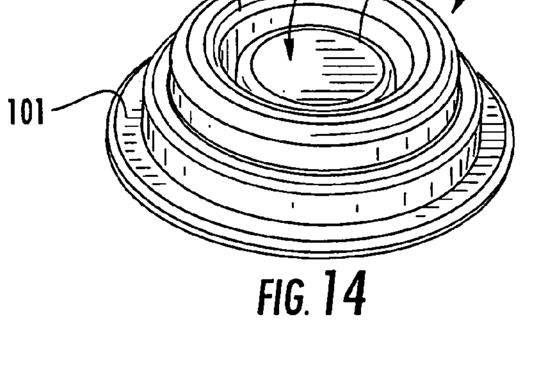
FIG. 14 is an enlarged perspective view of the cable seating indicator used in the electrical connector as shown in FIG. 12.
Figure 15:
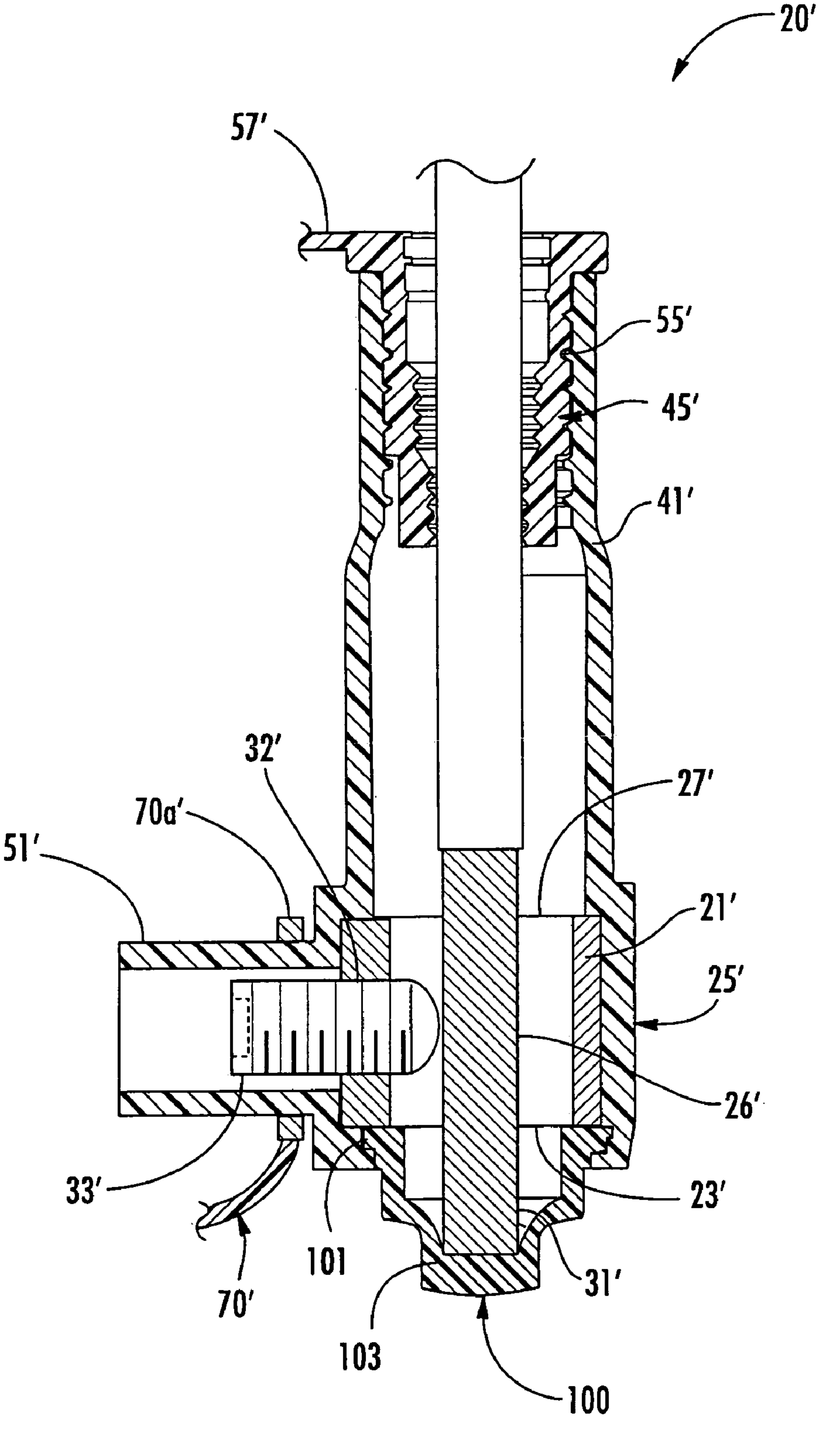
FIG. 15 is a transverse cross-sectional view of the electrical connector as shown in FIG. 12.

Each moveable cable seating indicator 100 illustratively includes a mounting flange 101 and a pop-out indicator 103 extending outwardly therefrom, with the mounting flange being overlapped by adjacent portions of the insulating cover 25'. The mounting flange 101 and the pop-out indicator 103 may be integrally formed as a monolithic unit, for example. The pop-out indicator 103 illustratively includes a pleated cylindrical sidewall 104 and a closed end cap 105 connected to the sidewall (FIGS. 13 and 14). The pop-out indicator 103 also facilitates placement of the cable end 31' well past the fastner 33' to provide a more reliable and secure connection.

As will be appreciated by those skilled in the art, in this embodiment of the connector 20' the moveable cable seating indicator 100 need not be formed of a transparent material. For example, each moveable cable seating indicator 100 may comprise TPE, or other material, to form a strong bond with the TPE of the insulating cover 25'. The cable seating indicators 100 may also comprise polypropylene, or other similar materials as will be readily appreciated by those skilled in the art. The moveable cable seating indicator 100 may include carbon black or other materials to provide UV protection as will also be appreciated by those skilled in the art. Those other elements of the connector 20' not specifically mentioned are similar to elements described above with reference to the embodiment 20 shown in FIGS. 1–11. These other elements are indicated with prime notation and need no further discussion herein.

Returning again to FIGS. 1–7, one method aspect is for making an electrical connector 20 for a plurality of electrical cables. The method may include forming an electrically conductive body 21 to have a plurality of spaced apart cable-receiving passageways 26 for receiving respective insulation-free electrical cable ends 31 therein. Each cable-receiving passageway 26 may have a cable inlet opening 27 and a cable end viewing opening 23 opposite the cable inlet opening. The conductive body 21 may also be formed to have at least one respective fastener-receiving passageway 32 intersecting each of the cable-receiving passageways 26.

The method may further include aligning a respective electrically insulating transparent viewing window 24 adjacent each of the cable end viewing openings 23 to provide a cover and to permit visual confirmation of proper placement of the insulation-free electrical cable end 31 within a corresponding one of the cable-receiving passageways 26. In addition, the method may include overmolding an insulating cover 25 on the electrically conductive body 21 and having a respective window opening 35 therein aligned with each of the transparent viewing windows 24. The insulating cover 25 may comprise TPE forming an integrally molded bond with adjacent portions of the electrically insulating transparent viewing windows 24.

Returning again additionally to FIGS. 8 and 9, another method aspect is also for making an electrical connector 20 for a plurality of electrical cables. The method may include forming an electrically conductive body 21 to have a plurality of spaced apart cable-receiving passageways 26 for receiving respective electrical cable ends 31 therein, with each cable-receiving passageway having a cable inlet opening 27. The electrically conductive body 21 may be formed to have at least one respective fastener-receiving passageway 32 intersecting each of the cable-receiving passageways 26.

The method may also include forming an insulating cover 25 on the electrically conductive body 21 and comprising an integrally molded respective tubular cable inlet 41 aligned with each of the cable inlet openings 27. The method may also comprise positioning a respective insulating boot 45 in each of the tubular cable inlets 41. Moreover, each of the insulating boots 45 may comprise a tubular sidewall 55 having a progressively increasing diameter to an open outer end 56 thereof, a removable boot closure cap 57 for removable positioning in the open outer end of the tubular sidewall, and an integrally molded tether 58 connecting the removable boot closure cap to the tubular sidewall.

Another aspect of the invention relates to a method for making an electrical connector for a plurality of electrical cables as explained with reference again to FIGS. 1–7, 10 and 11. The method may include forming an electrically conductive body 21 to have a plurality of spaced apart cable-receiving passageways 26 for receiving respective electrical cable ends 31 therein. Each cable-receiving passageway 26 may have a cable inlet opening 27. The conductive body 21 may also be formed to have at least one respective fastener-receiving passageway 32 intersecting each of the cable-receiving passageways 26.

The method may further comprise forming an insulating cover 25 on the electrically conductive body 21, and comprising a respective integrally molded tubular fastener inlet 51 aligned with each of the fastener-receiving openings 32. The method may also include forming a respective flexible tether and cap assembly with the tether 70 having a proximal end **70*a* to be removably connected adjacent a corresponding tubular fastener inlet 51, and a distal end 70*b* integrally molded with a corresponding removable fastener inlet closure cap 53. The method may also include removably connecting each proximal end 70*a* on a respective tubular fastener inlet 51, and positioning each removable fastener inlet closure cap 53** in a respective tubular fastener inlet.

Returning again to FIGS. 12–15, another method aspect is for making an electrical connector 20' for a plurality of electrical cables. The method may include forming an electrically conductive body 21' to have a plurality of spaced apart cable-receiving passageways 26' for receiving respective electrical cable ends 31' therein. Each cable-receiving passageway 26' may have a cable inlet opening 27' and a cable seating indicator opening 23' opposite the cable inlet opening. The conductive body 21' may also be formed to have at least one respective fastener-receiving passageway 32' intersecting each of the cable-receiving passageways 26'.

The method may further include aligning a respective moveable cable seating indicator window 100 adjacent each of the seating indicator openings 23' to provide a cover and to permit visual confirmation of proper placement of the insulation-free electrical cable end 31' within a corresponding one of the cable-receiving passageways 26'. In addition, the method may include overmolding an insulating cover 25' on the electrically conductive body 21' and having a respective opening 35' therein aligned with each of the moveable seating indicators 100. The insulating cover 25' may comprise TPE forming an integrally molded bond with adjacent portions of the moveable, electrically insulating, cable seating indicators 100.

Other features and advantages of the present invention may be found in copending patent applications filed concurrently herewith and assigned to the assignee of the present invention and are entitled ELECTRICAL CONNECTOR INCLUDING VIEWING WINDOWS AND ASSOCIATED METHODS, Ser. No. 11/026,809; ELECTRICAL CONNECTOR INCLUDING INSULATING BOOTS AND ASSOCIATED METHODS, Ser. No. 11/026,978; and ELECTRICAL CONNECTOR INCLUDING REMOVABLE TETHER AND CAP ASSEMBLIES AND ASSOCIATED METHODS, Ser. No. 11/027,885, the entire disclosures of which are incorporated herein in their entirety by reference. In addition, many modifications and other embodiments of the invention will come to the mind of one skilled in the art having the benefit of the teachings presented in the foregoing descriptions and the associated drawings. Accordingly, it is understood that the invention is not to be limited to the illustrated embodiments disclosed, and that other modifications and embodiments are intended to be included within the spirit and scope of the appended claims.

That which is claimed is:

1. An electrical connector for a plurality of electrical cables comprising:

an electrically conductive body having a plurality of spaced apart cable-receiving passageways for receiving respective electrical cable ends therein, each cable-receiving passageway having a cable inlet opening and a cable end opening opposite the cable inlet opening;

said electrically conductive body also having at least one respective fastener-receiving passageway intersecting each of the cable-receiving passageways;

a respective fastener in each of the fastener-receiving passageways;

a respective moveable, electrically insulating, cable seating indicator positioned adjacent each of the cable end openings to provide a cover and to permit visual confirmation of proper placement of the electrical cable end within a corresponding one of the cable-receiving passageways based upon movement relative to said electrically conductive body; and an insulating cover on said electrically conductive body and having respective seating indicator openings therein aligned with said moveable, electrically insulating, cable seating indicators.

2. An electrical connector according to claim 1 wherein said insulating cover comprises a thermoplastic elastomer (TPE) forming an integrally molded bond with adjacent portions of said moveable, electrically insulating, cable seating indicators.

3. An electrical connector according to claim 1 wherein each of said moveable, electrically insulating, cable seating indicators comprises TPE.

4. An electrical connector according to claim 1 wherein said electrically conductive body has a generally rectangular shape.

5. An electrical connector according to claim 1 wherein each of said moveable, electrically insulating, cable seating indicators comprises a mounting flange and a pop-out indicator extending outwardly therefrom with said mounting flange being overlapped by adjacent portions of said insulating cover.

6. An electrical connector according to claim 5 wherein said mounting flange and said pop-out indicator are integrally formed as a monolithic unit.

7. An electrical connector according to claim 1 wherein said insulating cover further comprises an integrally molded respective tubular fastener inlet aligned with each of the fastener-receiving passageways.

8. An electrical connector according to claim 7 further comprising a respective removable fastener inlet closure cap for each of said tubular fastener inlets.

9. An electrical connector according to claim 8 further comprising a respective flexible tether connected between each of said tubular fastener inlets and a corresponding one of said removable fastener inlet closure caps.

10. An electrical connector according to claim 1 wherein said insulating cover comprises an integrally molded respective tubular cable inlet-aligned with each of the cable inlet openings.

11. An electrical connector according to claim 10 further comprising a respective insulating boot received in each of said tubular cable inlets.

12. An electrical connector according to claim 11 wherein each of said insulating boots comprises a tubular sidewall having a progressively increasing diameter to an outer open end thereof.

13. An electrical connector according to claim 12 further comprising a respective removable boot closure cap for the open outer end of each of said insulating boots.

14. An electrical connector for a plurality of electrical cables comprising:

an electrically conductive body having a plurality of spaced apart cable-receiving passageways for receiving respective electrical cable ends therein, each cable-receiving passageway having a cable inlet opening and a cable end opening opposite the cable inlet opening;

said electrically conductive body also having at least one respective fastener-receiving passageway intersecting each of the cable-receiving passageways;

a respective moveable, electrically insulating, cable seating indicator positioned adjacent each of the cable end openings to provide a cover and to permit visual confirmation of proper placement of the insulation-free electrical cable end within a corresponding one of the cable-receiving passageways; and an insulating cover on said electrically conductive body comprising a thermoplastic elastomer (TPE) and having respective seating indicator openings therein aligned with said moveable, electrically insulating, cable seating indicators, said insulating cover further comprising an integrally molded respective tubular cable inlet aligned with each of the cable inlet openings, and an integrally molded respective tubular fastener inlet aligned with each of the fastener-receiving passageways.

15. An electrical connector according to claim 14 wherein each of said pop-out indicators comprises TPE.

16. An electrical connector according to claim 14 wherein said electrically conductive body has a generally rectangular shape.

17. An electrical connector according to claim 14 wherein each of said moveable, electrically insulating, cable seating indicators comprises a mounting flange and a pop-out indicator extending outwardly therefrom with said mounting flange portion being overlapped by adjacent portions of said insulating cover.

18. An electrical connector according to claim 17 wherein said mounting flange and said pop-out indicator are integrally formed as a monolithic unit.

19. An electrical connector for a plurality of electrical cables comprising:

an electrically conductive body having a plurality of spaced apart cable-receiving passageways for receiving respective electrical cable ends therein, each cable-receiving passageway having a cable inlet opening and a cable end opening opposite the cable inlet opening;

said electrically conductive body also having at least one respective fastener-receiving passageway intersecting each of the cable-receiving passageways;

a respective moveable, electrically insulating, cable seating indicator positioned adjacent each of the cable end openings to provide a cover and to permit visual confirmation of proper placement of the electrical cable end within a corresponding one of the cable-receiving passageways based upon movement relative to said electrically conductive body; and an insulating cover on said electrically conductive body and having respective seating indicator openings therein aligned with said moveable, electrically insulating, cable seating indicators;

each of said moveable, electrically insulating, cable seating indicators comprising a pop-out indicator and a mounting flange extending outwardly therefrom, said mounting flange being overlapped by adjacent portions of said insulating cover.

20. An electrical connector according to claim 19 wherein said insulating cover and said pop-out indicators each comprises thermoplastic elastomer (TPE).

21. An electrical connector according to claim 19 wherein said insulating cover comprises an integrally molded respective tubular cable inlet aligned with each of the cable inlet openings.

22. An electrical connector according to claim 19 wherein said insulating cover further comprises an integrally molded respective tubular fastener inlet aligned with each of the fastener-receiving passageways.

23. An electrical connector according to claim 19 wherein said electrically conductive body has a generally rectangular shape.

24. A method for making an electrical connector for a plurality of electrical cables comprising:

forming an electrically conductive body to have a plurality of spaced apart cable-receiving passageways for receiving respective electrical cable ends therein, each cable-receiving passageway having a cable inlet opening and a cable end opening opposite the cable inlet opening, and at least one respective fastener-receiving passageway intersecting each of the cable-receiving passageways;

aligning a respective moveable, electrically insulating, cable seating indicator adjacent each of the cable end openings to provide a cover and to permit visual confirmation of proper placement of the electrical cable end within a corresponding one of the cable-receiving passageways based upon movement relative to said electrically conductive body; and overmolding an insulating cover on the electrically conductive body and having a respective seating indicator opening therein aligned with each of the moveable, electrically insulating, cable seating indicators.

25. A method according to claim 24 wherein the insulating cover comprises a thermoplastic elastomer (TPE) forming an integrally molded bond with adjacent portions of the moveable, electrically insulating, cable seating indicators.

26. A method according to claim 24 further comprises positioning a respective fastener in each of the fastener-receiving passageways.

27. A method according to claim 24 wherein each of the moveable, electrically insulating, cable seating indicators comprises a mounting flange and a pop-out indicator extending outwardly therefrom with the mounting flange being overlapped by the adjacent portions of the insulating cover.

28. A method according to claim 24 wherein the insulating cover and each of the moveable, electrically insulating, cable seating indicators comprises thermoplastic elastomer (TPE).

29. A method according to claim 24 wherein overmolding the insulating cover further comprises overmolding the insulating cover to include an integrally molded respective tubular cable inlet aligned with each of the cable inlet openings, and an integrally molded respective tubular fastener inlet aligned with each of the fastener-receiving passageways.

* * * * *

UNITED STATES PATENT AND TRADEMARK OFFICE
CERTIFICATE OF CORRECTION

PATENT NO. : 6,997,759 B1
APPLICATION NO. : 11/026810
DATED : February 14, 2006
INVENTOR(S) : Zahnen et al.

It is certified that error appears in the above-identified patent and that said Letters Patent is hereby corrected as shown below:

| | |
|---|---|
| Column 1, Line 33 | Delete: "@"<br>Insert: --®-- |
| Column 5, Line 36 | Delete: "inlet aligned 41"<br>Insert: --inlet 41 aligned-- |
| Column 6, Line 49 | Delete: "eng"<br>Insert: --end-- |
| Column 10, Line 23 | Delete: "inlet-aligned"<br>Insert: --inlet aligned-- |

Signed and Sealed this

Third Day of October, 2006

JON W. DUDAS

*Director of the United States Patent and Trademark Office*